United States Patent [19]

Yamazaki

[11] 4,387,387

[45] Jun. 7, 1983

[54] PN OR PIN JUNCTION TYPE SEMICONDUCTOR PHOTOELECTRIC CONVERSION DEVICE

[76] Inventor: Shunpei Yamazaki, 21-21 Kitakarasuyama 7-chome, Setagaya-ku, Tokyo, Japan

[21] Appl. No.: 177,409

[22] Filed: Aug. 12, 1980

[30] Foreign Application Priority Data

Aug. 13, 1979 [JP] Japan .................................. 54/102905
Aug. 13, 1979 [JP] Japan .................................. 54/102906

[51] Int. Cl.³ .................. H01L 27/14; H01L 29/161; H01L 29/167
[52] U.S. Cl. ........................................ 357/30; 357/61; 357/63
[58] Field of Search .............................. 357/30, 61, 63

[56] References Cited

U.S. PATENT DOCUMENTS

| | | | |
|---|---|---|---|
| 4,139,858 | 2/1979 | Pankove | 357/30 OR |
| 4,162,505 | 7/1979 | Hanak | 357/30 OR |
| 4,167,015 | 9/1979 | Hanak | 357/30 X |
| 4,177,474 | 12/1979 | Ovshinsky | 357/63 X |
| 4,281,208 | 7/1981 | Kuwano et al. | 357/30 X |

Primary Examiner—Martin H. Edlow
Assistant Examiner—J. Carroll
Attorney, Agent, or Firm—Gerald J. Ferguson, Jr.; Joseph J. Baker

[57] ABSTRACT

A PN or PIN junction type semiconductor photoelectric conversion device which comprises a semiconductor layer having formed therein at least one PN or PIN junction, a light-transparent, conductive layer disposed on the semiconductor layer and a conductive layer disposed on the semiconductor layer on the opposite side from the light-transparent, conductive layer, and in which light is incident to the semiconductor layer from the outside of the light-transparent, conductive layer, a photoelectric conversion function is obtained by the presence of the barrier of the PN or PIN junction formed in the semiconductor layer.

In such a PN or PIN junction type semiconductor photoelectric conversion device, a light-transparent, current-permeable nitride layer is artificially formed between the semiconductor layer and the light-transparent, conductive layer. The light-transparent, current-permeable nitride layer is a conductive, insulating or semi-insulating layer. The conductive nitride layer is made of a conductive metal nitride. The insulating nitride layer is made of a silicon nitride. The semi-insulating nitride layer is made of a silicon nitride and a conductive metal nitride.

3 Claims, 4 Drawing Figures

PN OR PIN JUNCTION TYPE SEMICONDUCTOR PHOTOELECTRIC CONVERSION DEVICE

BACKGROUND OF THE INVENTION

1. Field of the Invention

This invention relates to a PN or PIN junction type semiconductor photoelectric conversion device which is of particular utility when employed in a solar battery.

2. Description of the Prior Art

A PN or PIN junction type semiconductor photoelectric conversion device is, in principle, provided with a semiconductor layer having formed therein at least one PN or PIN junction, a light-transparent, conductive layer deposited on the semiconductor layer and a conductive layer deposited on the semiconductor layer on the opposite side from the light-transparent, conductive layer; and the PN or PIN junction type semiconductor photoelectric conversion device is arranged so that when light is incident to the semiconductor layer from the outside of the light-transparent, conductive layer, a photoelectric conversion function is provided by the presence of a barrier which is set up by the PN or PIN junction.

In such a conventional PN or PIN junction type semiconductor photoelectric conversion device, there is interposed between the semiconductor layer and the light-transparent, conductive layer a layer which is formed unartificially during the deposition of the light-transparent, conductive layer on the semiconductor layer and which is formed of an oxide of the semiconductor forming the semiconductor layer and has a sufficiently small thickness to permit the passage therethrough of a current. Since the semiconductor layer is usually formed of silicon, the abovesaid layer sandwiched between the semiconductor layer and the light-transparent conductive layer is usually formed of a silicon oxide.

Such an oxide layer interposed between the semiconductor layer and the light-transparent, conductive layer has active oxygen, and hence is unstable chemically. Accordingly, the oxide layer, when heated, is liable to chemically react with the semiconductor layer, the light-transparent, conductive layer and an undesirable impurity from the outside. On the other hand, the PN or PIN junction in the semiconductor layer is formed as close to the light-transparent, conductive layer as possible so as to provide for enhanced photoelectric conversion efficiency.

Accordingly, the conventional PN or PIN junction type photoelectric conversion device has the defect that when it is exposed to high temperature for a long time, the thickness and height of the barrier set up by the PN or PIN junction varies, resulting in degraded photoelectric conversion characteristic and lowered photoelectric conversion efficiency.

In general, the oxide layer has a large energy band gap and when the oxide layer is a silicon oxide layer, the energy band gap is as large as 8 eV.

Consequently, even if the oxide layer interposed between the semiconductor layer and the light-transparent, conductive layer is so thin that a current may pass through the oxide layer, the layer itself does not readily permit the passage therethrough of a current and has a high resistance.

Accordingly, the prior art PN or PIN junction type semiconductor photoelectric conversion device has the defects of poor photoelectric conversion characteristic and very low photoelectric conversion efficiency.

Furthermore, in the conventional PN or PIN junction type semiconductor photoelectric conversion device, even if the oxide layer is interposed between the semiconductor layer and the light-transparent, conductive layer, the oxide layer is likely to pass an undesirable impurity from the light-transparent, conductive layer or the outside thereof to the semiconductor layer and an useful impurity introduced in the semiconductor layer to the light-transparent, conductive layer.

As a consequence, the conventional PN or PIN junction type semiconductor photoelectric conversion device is defective in that in a long use, the photoelectric conversion characteristic is deteriorated and, in particular, the photoelectric conversion efficiency is lowered.

Moreover, since the oxide layer interposed between the semiconductor layer and the light-transparent, conductive layer is formed unartificially, there is the possibility of the oxide layer being formed so thick as not to permit the passage therethrough of a current.

Accordingly, the prior art PN or PIN junction type semiconductor photoelectric conversion device has the drawback that difficulties are involved in its manufacture.

SUMMARY OF THE INVENTION

Accordingly, it is an object of the present invention to provide a novel PN or PIN junction type semiconductor photoelectric conversion device which is free from the abovesaid shortcomings of the prior art.

In the PN or PIN junction type semiconductor photoelectric conversion device according to the present invention, a light-transparent, conductive layer is deposited on a semiconductor layer having formed therein at least on PN or PIN junction, as is the case with the prior art, but there is provided between the light-transparent, conductive layer and the semiconductor layer a light-transparent and current-permeable nitride layer which is formed artificially in place of the aforementioned oxide layer formed unartificially.

The abovesaid light-transparent, current-permeable nitride layer thus interposed between the semiconductor layer and the light-transparent conductive layer has no active oxygen, and hence is very stable chemically. Therefore, the nitride layer, even if heated, does not readily react chemically with the semiconductor layer, the light-transparent, conductive layer and an undesirable impurity from the outside.

Accordingly, the PN or PIN junction type semiconductor photoelectric conversion device of the present invention has the advantage that even if it is placed in a high temperature condition for many hours, the thickness and height of the barrier set up by the PN or PIN junction formed in the semiconductor layer hardly vary, and consequently the photoelectric conversion characteristic and the photoelectric conversion efficiency are hardly degraded.

In general, a layer formed of a nitride has a smaller energy band gap than that of an oxide layer.

Therefore, the abovesaid nitride layer interposed between the semiconductor layer and the light-transparent, conductive layer readily passes therethrough a current and has a low resistance as compared with the oxide layer.

Accordingly, the PN or PIN junction type semiconductor photoelectric conversion device of the present invention is excellent in photoelectric conversion characteristic and far higher in photoelectric conversion efficiency as compared with the prior art PN or PIN junction type semiconductor photoelectric conversion device described previously.

Moreover, the abovesaid nitride layer interposed between the semiconductor layer and the light-transparent, conductive layer substantially inhibits the passage therethrough of an undesirable impurity from the light-transparent, conductive layer or the outside thereof to the semiconductor layer and an useful impurity introduced in the semiconductor layer to the light-transparent, conductive layer.

Accordingly, the PN or PIN junction type semiconductor photoelectric conversion device of the present invention has such an advantage that even after it is used for a long time, the photoelectric conversion characteristic and the photoelectric conversion efficiency are hardly deteriorated.

Furthermore, since the nitride layer is formed artificially, even when it is formed to have an insulating property, an oxide layer which tends to be formed unartificially between the semiconductor layer and the light-transparent, conductive layer is not formed, and since the nitride layer is very stable chemically, it can easily be formed to be current-permeable.

Accordingly, the PN or PIN junction type semiconductor photoelectric conversion device of the present invention can easily be manufactured to be equipped with predetermined photoelectric conversion characteristic and high photoelectric conversion efficiency.

Other subjects, features and advantages of the present invention will become apparent from the following description taken in conjunction with the accompanying drawings.

DESCRIPTION OF THE PREFERRED EMBODIMENTS

Figure 1:
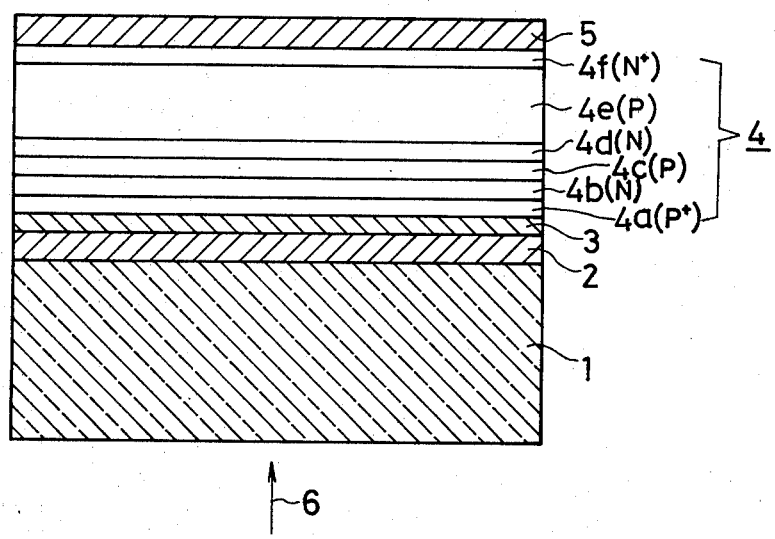
FIG. 1 is a schematic sectional view illustrating an embodiment of the PN junction type semiconductor photoelectric conversion device of the present invention.

FIG. 1 illustrates in section an embodiment of the PN junction type semiconductor photoelectric conversion device of the present invention, in which a light-transparent, conductive layer 2 is formed on a transparent substrate 1 as of glass.

The light-transparent, conductive layer 2 may be formed of a conductive metal oxide, which is selected from a group consisting of indium oxide, tin oxide and antimony oxide, or a mixture or compound of two or more kinds of them. The light-transparent, conductive layer 2 may also be formed by introducing into the abovesaid conductive metal oxide layer, in an amount of 0.1 to 10% relative thereto, a conductive material which is selected from a group consisting of tantalum, tungsten, molybdenum, zirconium, titanium, vanadium, chromium, lead, nickel, tin and germanium, or a mixture or compound of two or more kinds of them. Also it is possible to form the light-transparent, conductive layer 2 of a conductive metal nitride, which is selected from a group consisting of titanium nitride, tantalum nitride, tin nitride, antimony nitride, germanium nitride, niobium nitride, tungsten nitride and chromium nitride, or a mixture or compound of two or more kinds of them. Further, the light-transparent, conductive layer 2 may also be obtained by introducing the abovesaid conductive material into the abovementioned conductive metal nitride layer. Also the light-transparent, conductive layer 2 may be a layer which is formed of the abovesaid metal oxide and metal nitride and into which the abovementioned conductive material is introduced.

On the light-transparent, conductive layer 2 is formed a nitride layer 3 which is light-transparent and current-permeable.

The nitride layer 3 may be a conductive layer, whose thickness can be selected as desired, for example, 0.3 to 3μ. The conductive nitride layer 3 can be formed of a metal nitride, which is selected from the group of titanium nitride, tantalum nitride, tin nitride, tungsten nitride and chromium nitride, or a mixture or compound of two or more kinds of them. Such a metal nitride layer 3 can be formed by known vapor growth method. Further, the conductive nitride layer 3 can also be obtained by introducing the aforesaid conductive material into the abovesaid metal nitride layer. The nitride layer 3 may also be made an insulating or semi-insulating layer and, in this case, the layer 3 is formed thin enough to permit the passage therethrough of a current, for instance, 5 to 100 A thick. The insulating nitride layer 3 in this case may be formed as a silicon nitride layer, and the semi-insulating nitride layer 3 may also be obtained by introducing the aforesaid conductive material into the silicon nitride layer. Furthermore, the semi-insulating nitride layer may be formed of the silicon nitride and the aforesaid conductive metal nitride and may also be obtained by introducing the aforementioned conductive material into such a layer. Nitrogen may also be introduced into the light-transparent conductive layer 2 and/or the light-transparent, current-permeable nitride layer 3 so as to enhance its chemical stability.

On the light-transparent, current-permeable nitride layer 3 overlying the light-transparent, conductive layer 2 is formed a known semiconductor layer 4 which is composed of a P+ type semiconductor layer 4a, an N type semiconductor layer 4b, a P type semiconductor layer 4c, an N type semiconductor layer 4d, a P type semiconductor layer 4e and an N+ type semiconductor layer 4f formed one on another in this order to provide five PN junctions.

The semiconductor layer 4 can be formed of a single crystal semiconductor, in particular, single crystal silicon but may also be a layer which is made, by known plasma CVD method, glow discharge method, low-pressure CVD method or the like, of a non-single-crystal semiconductor such as an amorphous semiconductor, a polycrystalline semiconductor or the like, especially, non-single-crystal silicon such as amorphous silicon, polycrystalline silicon or the like. Further, the semiconductor layer 4 may also be such a layer that the layer of the abovesaid non-single-crystal semiconductor, in particular, non-single-crystal silicon, formed on the nitride layer 3 is annealed by irradiation, for example, by laser light, into single crystal partially or wholly.

The latter is preferred since the carrier mobility is 10 to $10^3$ times as high as in the case of the former.

Nitrogen may also be introduced into the region of the semiconductor layer 4 on the side of the light-transparent, current-permeable nitride layer 3 to obtain a wide-to-narrow energy band gap structure in which the above said region of the semiconductor layer 4 has a larger energy band gap than a region of the layer 4 adjacent thereto, thereby to enable highly sensitive photoelectric conversion.

Deposited over the entire area of the surface of the semiconductor layer 4 on the opposite side from the nitride layer 3 is a conductive layer 5 which is a counterpart of the light-transparent, conductive layer 2. In this case, it is also possible to interpose between the semiconductor layer 4 and the conductive layer 5 a current-permeable nitride layer which is similar to the abovesaid light-transparent, current-permeable nitride layer 3 and need not always be light-transparent. Since the PN junction which greatly contributes to the photoelectric conversion in the semiconductor layer 4 is not positioned close to the conductive layer 5, however, the conductive layer 5 can be deposited directly on the semiconductor layer 4 to make ohmic contact therewith, as shown. The conductive layer 5 may be made of an arbitrary material; for example, the layer 5 can be formed as an aluminum layer made by vacuum evaporation. In the case of depositing the conductive layer 5 directly on the semiconductor layer 4, since the semiconductor layer 4f of the semiconductor layer 4 on the side of the conductive layer 5 is N+ type, the conductive layer 5 can be formed, by the CVD method, of a polycrystalline semiconductor doped with a large quantity of an N type impurity as a conductive material.

Figure 2:
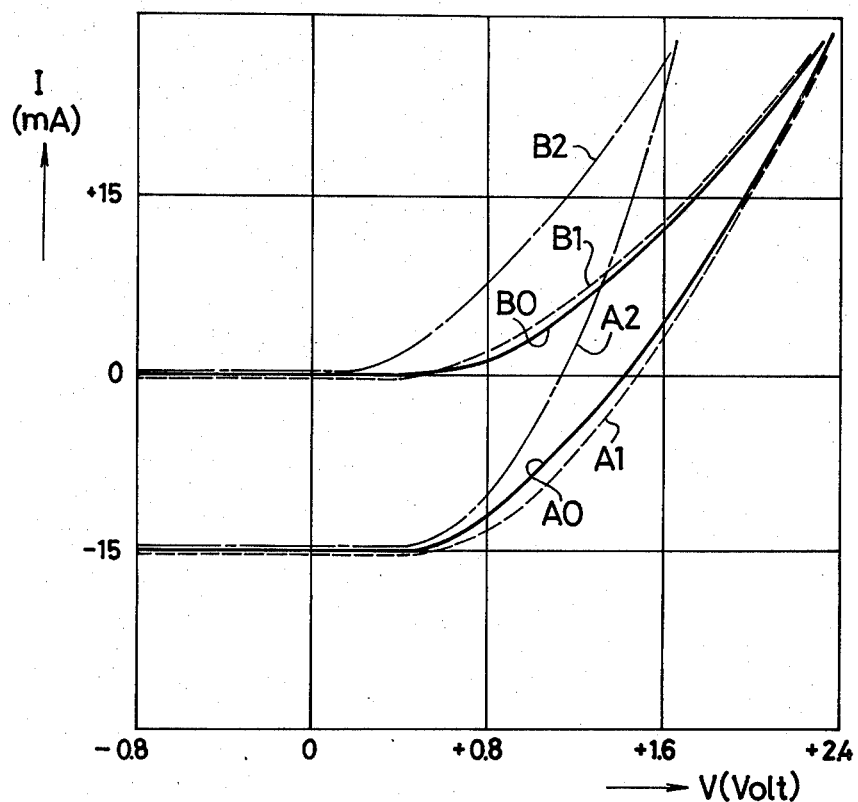
FIG. 2 is a V-I characteristic graph explanatory of the embodiment shown in FIG. 1.

The above is the construction of an embodiment of the PN junction type semiconductor photoelectric conversion device of the present invention. Since the above embodiment bears an apparent resemblance to the conventional PN junction type semiconductor photoelectric conversion device, the photoelectric conversion function can be obtained with the same mechanism as in the prior art. The mechanism, though not described in detail, is as follows: When light is incident to the semiconductor layer 4 through the light-transparent, conductive layer 2 and the light-transparent, current-permeable nitride layer 3 from the outside of the transparent substrate 1, as indicated by the arrow 6, carriers based on the incident light are produced in a depletion layer spreading from the PN junction formed in the semiconductor layer 4 on the side of the nitride layer 3 and electrons of the carriers reach the conductive layer 2 through the nitride layer 3 and holes reach the conductive layer 5. By this mechanism, there can be obtained such a photoelectric conversion function that a current corresponding to the intensity of the incident light flows via the conductive layers 2 and 5. Now, considering the photoelectric conversion function in the light of the relationship of a current I (milliampere (mA)) flowing through the conductive layers 2 and 5 with respect to a voltage V (volt (V)) applied to the conductive layers 2 and 5, that is, in the light of the V-I characteristic, the characteristic in the case of the light 6 being not incident can be obtained, as indicated by a curve AO in FIG. 2, and when the light 6 is incident with an intensity of AM 1 (the intensity of the sunlight on the equator, about 100 milliwatts/cm$^2$), the V-I characteristic can be obtained as shown by a curve BO in FIG. 2.

In the PN junction type semiconductor photoelectric conversion device of the present invention, shown in FIG. 1, however, the light-transparent, current-permeable nitride layer 3 is interposed between the semiconductor layer 4 and the light-transparent, conductive layer 2. The nitride layer 3 has no active oxygen, and hence is very stable chemically.

Accordingly, for the reasons set forth in "Summary of the Invention", the PN junction type semiconductor photoelectric conversion device of FIG. 1 exhibits such an advantage that even if when it is exposed to high temperature for many hours, the thickness and height of the barrier set up by the PN junction formed in the semiconductor layer 4 hardly vary, holding the photoelectric conversion characteristic and the photoelectric conversion efficiency substantially unchanged. This has been ascertained by my experiments in which after the PN junction type semiconductor photoelectric conversion device of FIG. 1 was exposed to as high a temperature as 150° C. for as long a time as 1000 hours, the same V-I characteristic as that when the curves AO and BO were obtained was such as shown by curves A1 and B1 in FIG. 2 which were substantially the same as the curves AO and BO. Incidentally, a similar experiment was also conducted on a semiconductor photoelectric conversion device which was identical in construction with the embodiment of FIG. 1 except in that the nitride layer 3 interposed between the semiconductor layer 4 and the light-transparent, conductive layer 2 was replaced by an oxide layer and which had such a V-I characteristic as shown by the curves AO and BO in FIG. 2. After the semiconductor photoelectric conversion device was similarly exposed to the high temperature of 150° C. for 1000 hours, the same V-I characteristic as that when the curves AO and BO were obtained was measured. The V-I characteristic thus measured was such as shown by curves A2 and B2 which greatly differed from the curves AO and BO; namely, the V-I characteristic was very poor as compared with the V-I characteristic of the device of the present invention.

In the embodiment of FIG. 1, the nitride layer 3 interposed between the semiconductor layer 4 and the light-transparent, conductive layer 2 has a small energy band gap as compared with the oxide layer. In other words, the nitride layer 3 readily passes therethrough a current and has a low resistance.

As a result of that, the embodiment of FIG. 1 has such an excellent feature that the photoelectric conversion efficiency is 20 to 40% higher than that obtainable with the conventional PN junction type semiconductor conversion device.

Furthermore, the nitride layer 3 in the embodiment of FIG. 1 substantially inhibits the passage therethrough of an undesirable impurity from the light-transparent, conductive layer 2 or the outside thereof to the semiconductor layer 4 and an effective impurity introduced in the semiconductor layer 4 to the light-transparent, conductive layer 2.

Accordingly, the embodiment of FIG. 1 is advantageous in that even after it is used for a long period of time, the photoelectric conversion characteristic is hardly deteriorated and the photoelectric conversion efficiency is hardly lowered.

Moreover, the nitride layer 3 is formed artificially; namely, in the course of its formation, an oxide layer which would otherwise be formed between the semiconductor layer 4 and the light-transparent, conductive layer 2 is prevented substantially, and the nitride layer 3 is very stable chemically. Therefore, the nitride layer 3 can easily be formed to be current-permeable.

Accordingly, the embodiment of FIG. 1 can easily be fabricated to have a predetermined photoelectric conversion characteristic and high photoelectric conversion efficiency.

Figure 3:
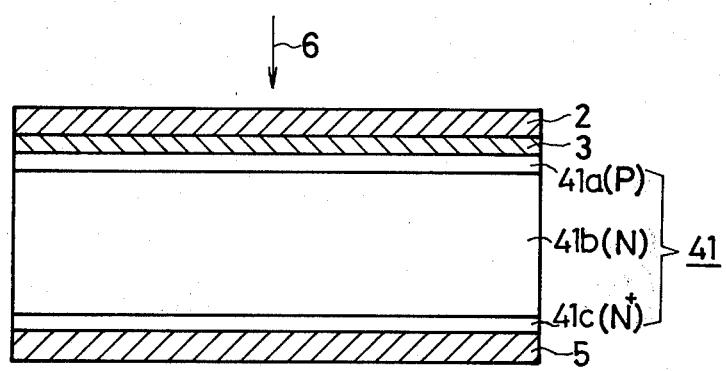
FIG. 3 is a schematic sectional view illustrating another embodiment of the PN junction type semiconductor photoelectric conversion device of the present invention.

FIG. 3 illustrates another embodiment of the PN junction type semiconductor photoelectric conversion device of the present invention. The illustrated embodiment is identical in construction with the embodiment of FIG. 1 except in that the transparent substrate 1 is omitted, and in that the semi-conductor layer 4 is replaced with a known semiconductor layer 41 composed of a P type semiconductor layer 41a, an N type semiconductor layer 41b and an N+ type semiconductor layer 41c formed in this order on the light-transparent, conductive nitride layer 3 to provide one Pn junction.

The above is the construction of another embodiment of the present invention. Since this embodiment is identical in construction with the embodiment of FIG. 1 except in the abovesaid points, no detailed description will be prepared but it has the same advantages as the embodiment of FIG. 1.

Figure 4:
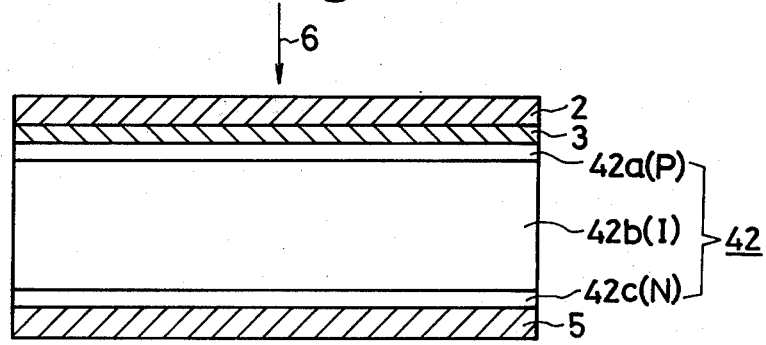
FIG. 4 is a schematic sectional view illustrating an embodiment of the PIN junction type semiconductor photoelectric conversion device of the present invention.

FIG. 4 illustrates an embodiment of the PIN junction type semiconductor photoelectric conversion device of the present invention. This embodiment is also identical in construction with the embodiment of FIG. 1 except in that the transparent substrate 1 is omitted, and in that the semiconductor layer 4 is substituted with a known semiconductor layer 42 composed of a P type semiconductor layer 42a, an intrinsic (I type) semiconductor layer 42b and an N type semiconductor layer 42c formed in this order on the light-transparent, conductive nitride layer 3 to provide one PIN junction.

The above is the construction of the embodiment of the PIN junction type semiconductor photoelectric conversion device of the present invention. Since this embodiment is identical in construction with the embodiment of FIG. 1 except in the abovesaid points, no detailed description will be repeated but it has the same advantages as the embodiment of FIG. 1.

The foregoing embodiments are merely illustrative of the present invention and should not be construed as limiting the present invention specifically thereto. Many modifications and variations may be effected without departing from the spirits of the present invention.

What is claimed is:

1. A PN or PIN junction type semiconductor photoelectric conversion device which comprises a semiconductor layer having formed therein at least one PN or PIN junction, a light-transparent, conductive layer disposed on the semiconductor layer, and a conductive layer disposed on the semiconductor layer on the opposite side from the light-transparent, conductive layer, characterized in that a light-transparent, current-permeable nitride layer is interposed between the semiconductor layer and the light-transparent, conductive layer, and that nitrogen introduced into at least the region of the semiconductor layer on the side of the light-transparent, current-permeable nitride layer forms a wide-to-narrow energy band gap structure in which the region of the semiconductor layer having introduced thereinto the nitrogen has a larger energy band gap than does a region of the semiconductor layer adjacent thereto.

2. A PN or PIN junction type semiconductor photoelectric conversion device according to claim 1 wherein the light-transparent, current-permeable nitride layer is formed of a conductive metal nitride selected from the group consisting of titanium nitride, tantalum nitride, tin nitride, tungsten nitride and chromium nitride.

3. A PN or PIN junction type semiconductor photoelectric conversion device according to claim 1 wherein the light-transparent conductive layer contains nitrogen.

* * * * *